(12) United States Patent
Law et al.

(10) Patent No.: US 10,333,104 B2
(45) Date of Patent: Jun. 25, 2019

(54) METHOD AND APPARATUS FOR ENCAPSULATION OF AN ORGANIC LIGHT EMITTING DIODE

(71) Applicant: ORBOTECH LT SOLAR, LLC., San Jose, CA (US)

(72) Inventors: Kam S. Law, San Jose, CA (US); Craig L. Stevens, Ben Lomond, CA (US); Masato Toshima, Sunnyvale, CA (US)

(73) Assignee: ORBOTECH LT SOLAR, LLC., San Jose, CA (US)

( * ) Notice: Subject to any disclaimer, the term of this patent is extended or adjusted under 35 U.S.C. 154(b) by 0 days.

(21) Appl. No.: 15/803,558

(22) Filed: Nov. 3, 2017

(65) Prior Publication Data

US 2018/0130975 A1    May 10, 2018

Related U.S. Application Data

(60) Provisional application No. 62/418,175, filed on Nov. 6, 2016.

(51) Int. Cl.
*B05D 7/24*     (2006.01)
*H01L 51/52*    (2006.01)
*C09D 183/04*   (2006.01)
*H01L 51/00*    (2006.01)
*H01L 51/56*    (2006.01)

(52) U.S. Cl.
CPC ........ *H01L 51/5253* (2013.01); *C09D 183/04* (2013.01); *H01L 51/0034* (2013.01); *H01L 51/56* (2013.01)

(58) Field of Classification Search
CPC .... B05D 1/62; H01L 51/5253; H01L 51/5256
See application file for complete search history.

(56) References Cited

U.S. PATENT DOCUMENTS

2014/0246655 A1*   9/2014  Chen .................. H01L 51/56
                                              257/40

* cited by examiner

*Primary Examiner* — Thomas L Dickey
(74) *Attorney, Agent, or Firm* — Womble Bond Dickinson (US) LLP; Joseph Bach, Esq.

(57) ABSTRACT

A substrate includes a plurality of OLED, each having a conductor layer. A coating is formed over the OLEDs, the coating comprises a first inorganic layer formed over the OLED structures and at least partially over each of the contact layers, a buffer layer over the first inorganic layer, a second inorganic layer over the buffer layer, wherein the buffer layer comprises a first inorganic interface layer in contact with the first inorganic layer, a second inorganic interface layer in contact with the second inorganic layer, and an organic layer sandwiched between the first and second inorganic interface layers.

18 Claims, 4 Drawing Sheets

METHOD AND APPARATUS FOR ENCAPSULATION OF AN ORGANIC LIGHT EMITTING DIODE

RELATED APPLICATION

This Application claims priority benefit from U.S. Provisional Application No. 62/418,175, filed on Nov. 6, 2016, the disclosure of which is incorporated herein by reference in its entirety.

BACKGROUND

1. Field of the Invention

Embodiments of the application relate to a method and apparatus for encapsulating an organic light emitting diode. Embodiments of the application also relate to a method and apparatus for fabrication of OLED display and touch screens.

2. Description of Related Art

Organic light emitting displays (OLED) are gaining traction due to their lower power consumption, lighter weight, wide color gamut, greater viewing angle, faster response time, higher contrast and to varying degrees enable flexibility as compared to the traditional liquid crystal displays (LCD). However, the OLED structures are susceptible to moisture and oxygen uptakes which will significantly degrade the performance of the displays. In order to protect the OLED structures, it is necessary to provide an encapsulation, including alternating inorganic and organic thin film layers.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In one embodiment of the present invention, a method for encapsulation of an organic light emitting diode is provided, comprising of forming an inorganic layer (SiNx, SiOx, SiON, Al2O3, etc), a buffer layer (of tunable inorganic/organic properties) and an inorganic layer in the same process chamber.

In another embodiment of the present invention, a method for encapsulation of an organic light emitting diode is provided, comprising of forming an inorganic layer, a primary organic layer and an inorganic layer in different process chambers.

In another embodiment a tunable buffer layer can be fabricated by PECVD from a mixture of vaporized organic silicon compound such as hexamethyldisiloxane (HMDSO) or tetramethydiloxane (TMDSO) or similar organic silicon analogs, preferably TMDSO, and inert gas (e.g. helium, argon etc) and an oxidizing gas (e.g. oxygen, nitrous oxide etc) of regulated quantities.

In another embodiment the mask alignment prior to encapsulation are carried out external to the process chambers, but in vacuum.

In another embodiment the apparatus may have a mask chamber for storage of masks.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

One or more embodiments of the present invention are illustrated by way of example and not limitation in the figures of the accompanying drawings, in which like references indicate similar elements and in which.

DETAILED DESCRIPTION

Embodiments of the inventive encapsulation system and method will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The present provisional provides a method and a system for thin film encapsulation of OLED structures disposed on a substrate, using one chamber or multi-chamber process where the mask alignment is external to the process chambers. The substrate and the mask are carried into the process chamber together to receive the deposition. Accurate alignment with good particle performance can be achieved in this arrangement.

Figure 1:
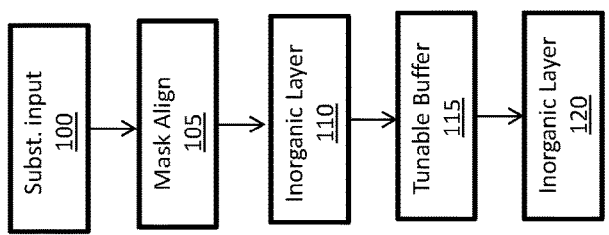
FIG. 1 is a flow diagram of a method for encapsulation according to an embodiment of the invention.

FIG. 1 is a flow diagram of a method for encapsulation for an embodiment one chamber process. The one chamber process starts with step 100, providing the system with a substrate having OLED structures already formed thereupon. The substrate also has a contact layer to enable energizing the OLED structure. At step 105, the mask is positioned on the substrate and aligned such that part of the contact is masked while the OLED structure is exposed. After alignment, the mask and the substrate are transferred together into the process chamber to receive the required deposition. At step 110 the first inorganic layers, which can be silicon nitride, silicon dioxide, silicon oxynitride, aluminum oxide, etc., is deposited over the OLED structure and the mask. At step 115 a tunable buffer layer is fabricated, where the flow ratios of oxidizing agent and the organic silicon analogs vary, as will be explained in more details below. A low ratio will provide a buffer layer of primarily organic in nature whereas a higher ratio would yield a layer of primarily inorganic in nature. The objective here is to provide layer a buffer layer with interfaces between the buffer layer and the layers above and below it to be of primarily inorganic in nature, whereas the bulk of the buffer layer to remains organic in nature. The inorganic nature of the layers provides good barrier for moisture and oxygen. The organic nature of the layer provides stress isolation and particle coverage. Step 120 provides an inorganic layer to finish the encapsulation. The whole process sequence may need to be repeated to satisfy the more stringent encapsulation requirements.

Therefore, according to this aspect a method for encapsulating an LED device is provided, comprising masking the LED structure to thereby partly cover the contact part and expose the LED structure, forming an inorganic layer through the mask, forming a tunable buffer layer, having variable organic and inorganic components, over the inorganic layer, and forming a cap inorganic layer over the tunable buffer layer.

Figure 2A:
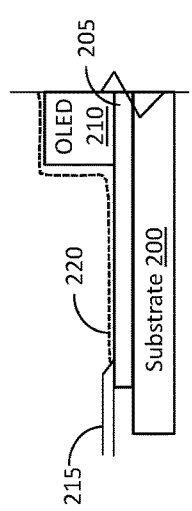
FIGS. 2A-2D illustrate cross section of the encapsulation layers formed according to an embodiment of the invention, utilizing three different masks.
Figure 2B:
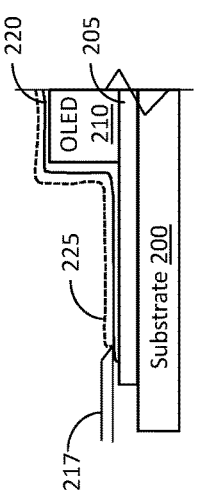
Figure 2C:
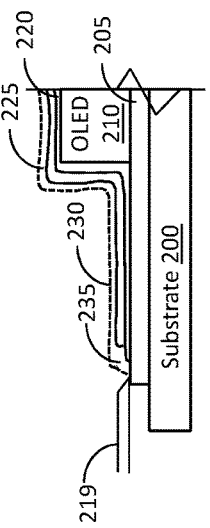
Figure 2D:
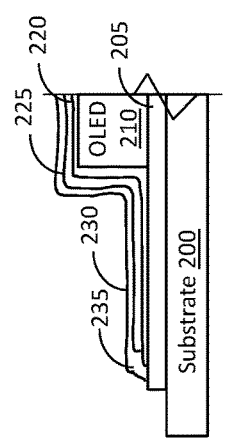

FIGS. 2A-2D illustrate cross section of the encapsulation layers formed according to an embodiment of the invention, utilizing three different masks. In FIG. 2A, a substrate 200 has a contact layer 205 and an OLED structure 210. Note that FIGS. 2A-2D illustrate just a small section of the substrate and masks in order to highlight the feature of this embodiment. Specifically, mask 215 has an opening such that when the mask is properly aligned on the substrate 200, it completely exposes the OLED structure 210 and covers only an edge of the contract layer 205. An inorganic layer 220 is then formed with the mask in place. At the end of the process, as shown in FIG. 2B, the mask is removed and a second mask 217, having smaller opening than the first mask 215, is aligned on the substrate so as to cover the edges of the inorganic layer 220 and the edge of the contact layer 205. A tunable buffer layer 225 is then formed over the inorganic layer 220 through the opening in the mask 217. Since the mask 217 has smaller opening than the first mask 215, the tunable buffer layer 225 does not cover the entire inorganic layer 220, i.e., the buffer layer 225 does not reach the edge of the inorganic layer 220 that is covered by the second mask 217. At the end of this process, as shown in FIG. 2C, a third mask 219 is aligned over the substrate. Mask 219 has larger opening than the first mask, such that it exposes the uncoated edge of the contact layer, the exposed edge of the inorganic layer 220, and the entire tunable buffer layer 225. A top inorganic layer 230 is the formed with the third mask in place. Since the third mask 219 has larger opening than the first mask, which is also larger than the opening of the second mask, the top inorganic layer 230 totally encapsulates the tunable buffer layer as shown by reference 235. The mask is then removed and the final structure is shown in FIG. 2D.

According to another embodiment, the process outlined with respect to FIG. 2A-2D is followed, except that instead of using a third mask 219, at the third stage the first mask is used again. This also provides full encapsulation of the tunable buffer layer. Moreover, the tunable inorganic nature of the buffer layer may not be needed in this case, as the organic layer is fully encapsulated by the subsequent capping inorganic layer. So, while in the description provided herein a special tunable inorganic layer is described, by using either the embodiment of FIGS. 2A-2D with two or three masks, any standard buffer layer may be used. For example, the buffer layer may be plasma-polymerized hexamethyldisiloxane (PP-HMDSO).

Therefore, according to another aspect a method for encapsulating an LED is provided, the method comprising forming an inorganic layer, wherein the inorganic layer extends over the entire structure of the LED, but partially exposes a contact layer of the LED; forming an organic buffer layer over the inorganic layer, wherein the organic layer extends over the inorganic layer, but partially exposes a periphery edge of the inorganic layer; forming a capping inorganic layer, wherein the capping inorganic layer extends over the entire organic buffer layer and the exposed periphery edge of the inorganic layer. The organic buffer layer may comprise a first interface layer in contact with the inorganic layer, a second interface layer in contact with the capping inorganic layer, and an organic layer sandwiched in between the first and second interface layers.

Figure 3:
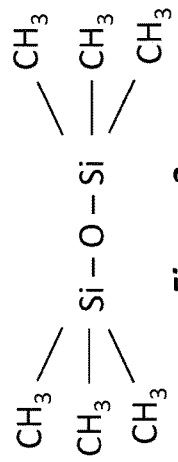
FIG. 3 illustrates the chemical structure of pp-HMDSO that can be used for a buffer layer according to various embodiments.
Figure 4:
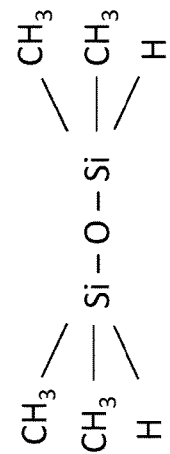
FIG. 4 illustrates the chemical structure of pp-TMDSO that can be used for a buffer layer according to various embodiments.

FIG. 3 illustrates the chemical structure of pp-HMDSO that can be used for a standard buffer layer. According to one embodiment, a tunable buffer layer is formed of plasma-polymerized tetramethyldisiloxane (pp-TMDSO), by replacing two $CH_3$ bonds with H bonds, as illustrated in FIG. 4. Such a formulation is referred to herein as pp-TMDSO. The tuning is done by controlling the flow of TMDSO and O2 gases during the formation of the layer, and properly adjusting the RF power applied to the plasma. Specifically, according to one embodiment, the flow ratio of O2 to TMDSO is held equal to or higher than eight to thereby form an inorganic layer, i.e., SiO2; while the ratio is held at two or below to form a soft vulcanization silicone layer, e.g., Room-Temperature-Vulcanizing silicone (RTV).

Figure 5:
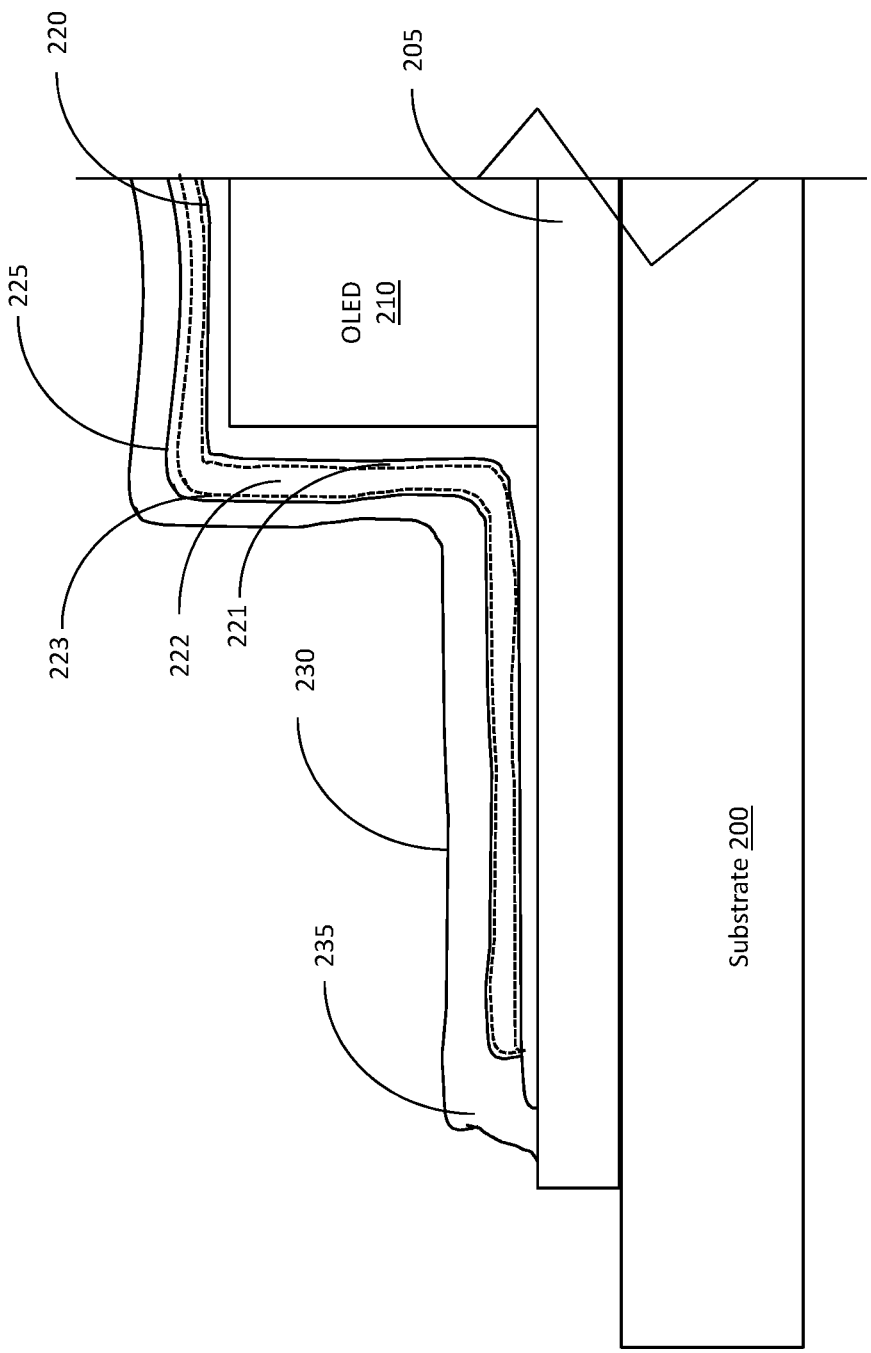
FIG. 5 illustrates a structure according to an embodiment of the invention.

Therefore, according to one embodiment, after forming the first inorganic layer, e.g., after step 110 of FIG. 1 or the step of FIG. 2A, the step of forming the buffer layer is divided into three sub-steps: first the ratio of O2 to TMDSO is adjusted to be eight or above, so as to form a thin SiOx interface layer, the ratio is then changed to be two or below to form the soft buffer layer, then, towards the end of the buffer layer forming process, the ratio is returned to eight or above, to form a thin interface layer of SiOx. Thereafter the process proceeds as described herein. Note that during the fabrication of the buffer layer the ratios may be changed gradually, such that the interface layer transitions into the soft buffer layer. The resulting structure is shown in FIG. 5, wherein buffer layer 225 is made up of hard interface layer 221, soft buffer layer 222, and hard interface layer 223.

As noted above, in various embodiments of the invention the tunable buffer layer can be a plasma-polymerized hexamethyldisiloxane HMDSO (pp-HMDSO) or plasma-polymerized tetramethyldisiloxane (pp-TMDSO), preferably pp-TMDSO. A pp-TMDSO provides higher deposition rate and better particle performance. Regardless of the composition utilized, the process of controlling the ratio of O2 to HMDSO or O2 to TMDSO can be employed so as to form the hard interface layers and soft bulk buffer layer, as shown in FIG. 5.

Figure 6:
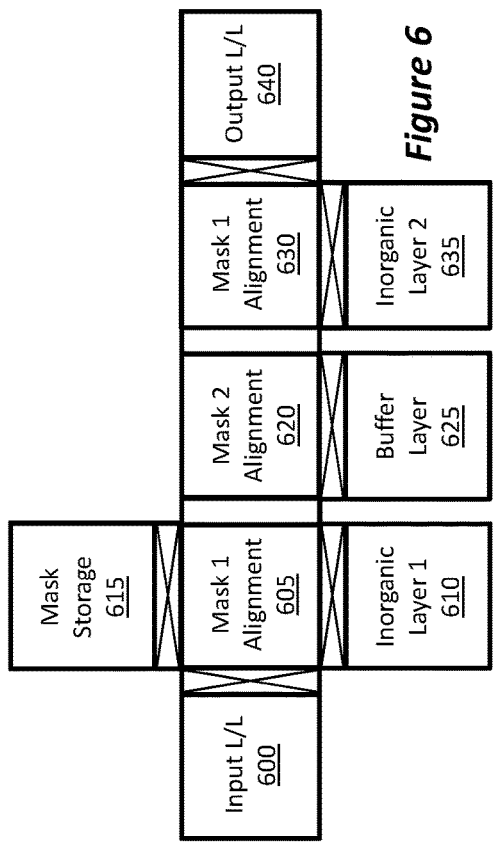
FIG. 6 is a block diagram of a scalable, configurable system architecture for encapsulation which consist of one or more process chambers, mask alignment chamber, mask storage chamber, and input and output loadlocks that maybe used to perform the encapsulation operations.

FIG. 6 illustrates a block diagram of an apparatus according to one embodiment, for forming the protective layer over the OLED. The substrate enters the system at the input loadlock chamber 600. Once appropriate vacuum level is achieved in the loadlock 600, the substrate is moved into mask 1 alignment chamber 605. A mask from mask storage chamber 615 is then transferred to mask alignment chamber 605 and is placed and aligned on the substrate. The substrate together with the mask is then transferred to inorganic layer forming chamber 610. Chamber 610 may be, e.g., a plasma deposition chamber. Once the first inorganic layer is formed, the substrate is returned to the mask alignment chamber 605 and the first mask is removed. The second mask is fetched from the mask storage chamber 615 and is placed and aligned on the substrate in mask 2 alignment chamber 620. The substrate with the mask then enters the buffer layer forming chamber 625, which may also be a plasma deposition and polymerization chamber. The substrate is then removed and mask 2 is removed from the substrate and mask 1 (or mask 3) are placed on and aligned to the substrate in mask 1 alignment chamber 630. The substrate with the mask then enter inorganic layer forming chamber 635, which may also be a plasma deposition chamber. The substrate is then returned to mask alignment chamber 630 so that the mask is removed and returned to the mask storage chamber 615 and then the substrate exits the system using output loadlock chamber 640.

According to one feature of the invention, after each layer forming process, the substrate with the mask exit the chamber, then the mask is returned to the chamber without the substrate, and plasma is ignited again inside the chamber. Conversely, according to another embodiment, provisions are made inside the processing chamber to lift the mask from the substrate, so that at the end of the process only the substrate is removed from the chamber, while the mask remains inside the chamber for a plasma cleaning cycle. The plasma cleaning cycle may be performed using gas that includes chlorine or fluorine or both, e.g., $NF_3$ gas. This helps clean both the interior of the chamber and the mask simultaneously. This can be done after each layer forming process in any of chambers 610, 625 and/or 635.

Another feature is that the alignment of the mask is performed in an alignment chamber where the substrate and the mask are aligned external to the process chamber, but in vacuum. After alignment, the substrate and the mask travel together into the process chamber to receive the deposition. This provides a simple and reliable system that generates fewer particles. Also, since the mask remains in vacuum, it can be returned into the chamber for in-situ plasma cleaning, or simply remain in the chamber when the substrate is removed.

Figure 7:
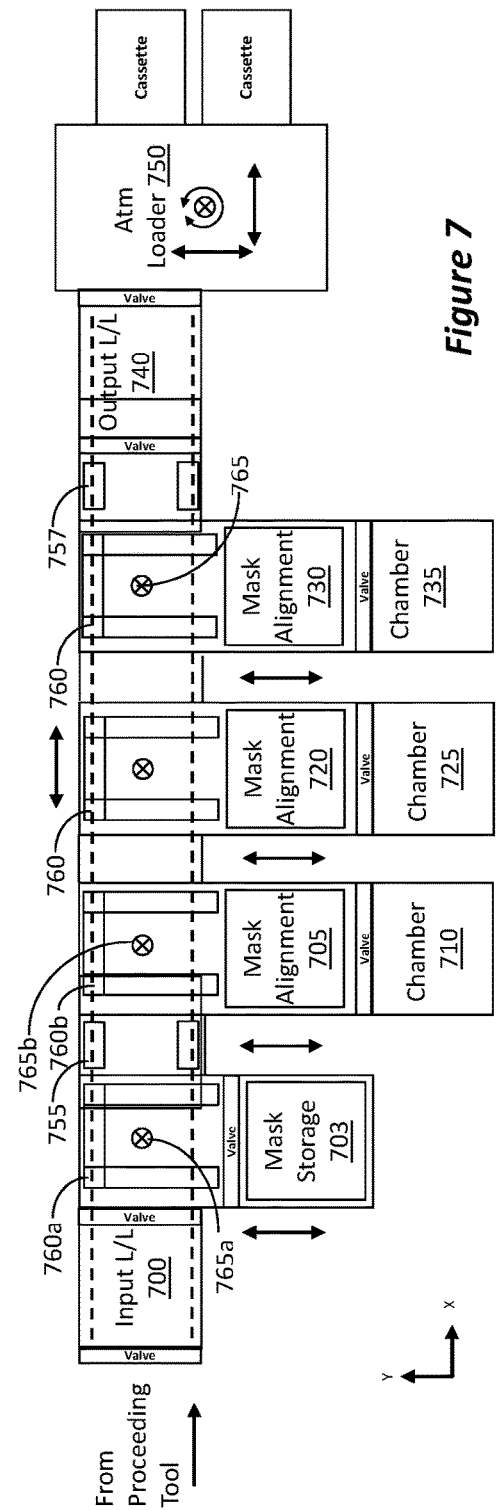
FIG. 7 illustrates another scalable, configurable system architecture for encapsulation which consist of one or more process chambers, mask alignment chamber, mask storage chamber, and input and output loadlocks that maybe used to perform the encapsulation operations.

FIG. 7 illustrates another embodiment of a system for forming CVD thin layers, e.g., protective layer, over the OLED. The system of FIG. 7 is a modular system, connecting process chambers through vacuum transfer backbone. The system is configurable between one to "N" process chambers depending on process requirements. The system may utilize magnetically coupled linear transfer system to transport substrates and masks among the process chambers. As in the system of FIG. 6, mask and substrate alignment is done outside of process chamber, but in vacuum. In this particular embodiment, there is one mask dedicated to every process chamber. Of course, if a blanket layer is to be deposited, then no mask is required.

In the embodiment illustrated in FIG. 7, transport in the x and y axes is performed separately by independent single-axis carriages. Load carriage 755 and unload carriage 757 transport substrates and/or masks in the x-axis direction exclusively, while loaders 760 transport substrates and/or masks in the y-axis exclusively. Z-lifters 765 are used to raise substrates and/or masks in the z-direction, i.e., elevation. This decoupling of motion in the three axes is somewhat contradictory to general approach in the art, as many commercial cluster robot arms are available, which can provide transport in all three axes at a relatively low cost and standard implementation. For example, the three-chamber embodiment of FIG. 7 requires four separate y-axes loaders 760, when a single track robot could have performed the same function, including the motion in the x-axis. However, this unique decoupled arrangement enables faster transport of substrates, and thus increases utilization of the process chambers.

Specifically, substrates are delivered into the input loadlock 700 and then vacuum is drawn inside the loadlock 700. Also, masks are stored in mask storage chamber 703. The masks can be delivered into the mask storage chamber 703 as follows. For example, cleaned masks can be loaded into the input loadlock 700. Once vacuum is drawn in loadlock 700, load carriage 755 removes the mask from the loadlock 700 and transfers it to the Z-lifter 765a. Then y-axis loader 760a removes it from the z-lifter 765a and transports it to the mask storage chamber 703. In this manner, several masks can be loaded into the mask storage chamber 703. The reverse process can be performed in order to remove masks from the system for cleaning or replacement.

When the mask is needed for processing, e.g., in chamber 710, the y-axis loader 760a removes the mask from the mask storage 703 and transfers it to the z-lifter 765a. The load carriage 755 then transfers the mask to z-lifter 765b. y-axis loader 760b removes the mask from the z-lifter 765b and transfers it into mask alignment chamber 705. Meanwhile, load carriage 755 removes a substrate from the loadlock 700 and transfers it to z-lifter 765b. y-axis loader 760b removes the substrate from the z-lifter 765b and transfers it into mask alignment chamber 705. The mask is then aligned to the substrate. When alignment is completed, the y-axis loader 760b removes the mask and substrate together from the mask alignment chamber 705 and transfers them into processing chamber 710. A similar process can be performed for each of the other chambers.

When processing is completed the y-axis loader 760b can remove the mask and substrate from the processing chamber 710. However, in one embodiment a different procedure is followed. Specifically, when processing is completed, the y-axis loader 760b removes only the substrate from the processing chamber 710 and transfers it to z-lifter 765 b. Meanwhile, cleaning plasma is ignited in processing chamber 710 to clean the chamber and the mask together. Unload carriage 757 takes the substrate from z-lifer 765b and transfers it either to output loadlock 740 (if processing on the substrate is completed) or to the next z-lifter if processing is to continue in the next processing chamber. Meanwhile, load carriage 755 loads a fresh substrate from loadlock 700 and transfers it to z-lifter 765b. The y-axis loader 760b then transfers the substrate into the mask alignment chamber 705. Consequently, when cleaning is completed in processing chamber 710, a fresh substrate is already present in the mask alignment chamber 705. Thus, y-axis loader 760b removes the mask from the processing chamber 710 and transfers it to be aligned with the substrate inside mask alignment chamber 705. Then the y-axis loader 760b loads the pair of mask and substrate into processing chamber 710.

According to another embodiment, each mask alignment chamber has two masks. When a mask-substrate pair is being processed inside the processing chamber 710, a clean mask is stored in the mask alignment chamber 705. When processing is completed, the y-axis loader 760b removes only the substrate from the processing chamber, and cleaning plasma is ignited to clean the processing chamber together with the mask. As the processed substrate is moved to the next mask alignment chamber or to the output loadlock, a fresh substrate is transported into the mask alignment chamber 705, and is aligned to the mask that is already inside. Consequently, when cleaning is completed, the cleaned mask can be removed to the alignment chamber 705, and the already aligned substrate and mask can be inserted into the chamber. In one embodiment the y-axis loader 760b is a "double-decker" loader having two loading arms one above the other, such that the unloading of the cleaned mask and loading of a fresh substrate with aligned mask can be performed simultaneously.

At the end of the process an atmospheric loader 750 can transfer processed substrates from the output loadlock 740 to the cassettes.

As can be seen from the embodiment of FIG. 7, a system for forming encapsulation of OLED structures on a substrate is provided. The system includes a loadlock chamber, a mask storage chamber, at least one deposition chamber, a linear transport chamber having carriage traveling exclusively in a single direction over the length of the linear transport chamber, a mask aligning chamber positioned between the linear transport chamber and the deposition chamber, a loader traveling exclusively in a single linear direction aligned with the linear transport chamber, the mask alignment chamber and the deposition chamber. The system may further include z-lifters enabling exchange of substrates between the carriage and the loader. The mask alignment chamber may include three actuators, each configured to push the mask at one corner of the mask. The mask alignment chamber may also include a camera configured to confirm alignment of the mask to the substrate.

As described above, for improved encapsulation of organic LED devices it is advantageous to have the top inorganic layer extend beyond the edges of the first inorganic layer and the buffer layer, such that the top inorganic layer completely encapsulates the first inorganic and buffer layers. On the other hand, the buffer layer does not reach the periphery of the first inorganic layer. In the embodiments having plurality of processing chamber, e.g., FIG. 7, this is achieved by having masks with different sized openings. However, in the embodiment illustrated in FIG. 8, only a single processing chamber is used. However, if different masks would be used, then for each layer the substrate would have to be removed and realigned with the next mask while the chamber is idle. To avoid having the chamber idle, in one embodiment the following procedure is implemented.

Figure 8:
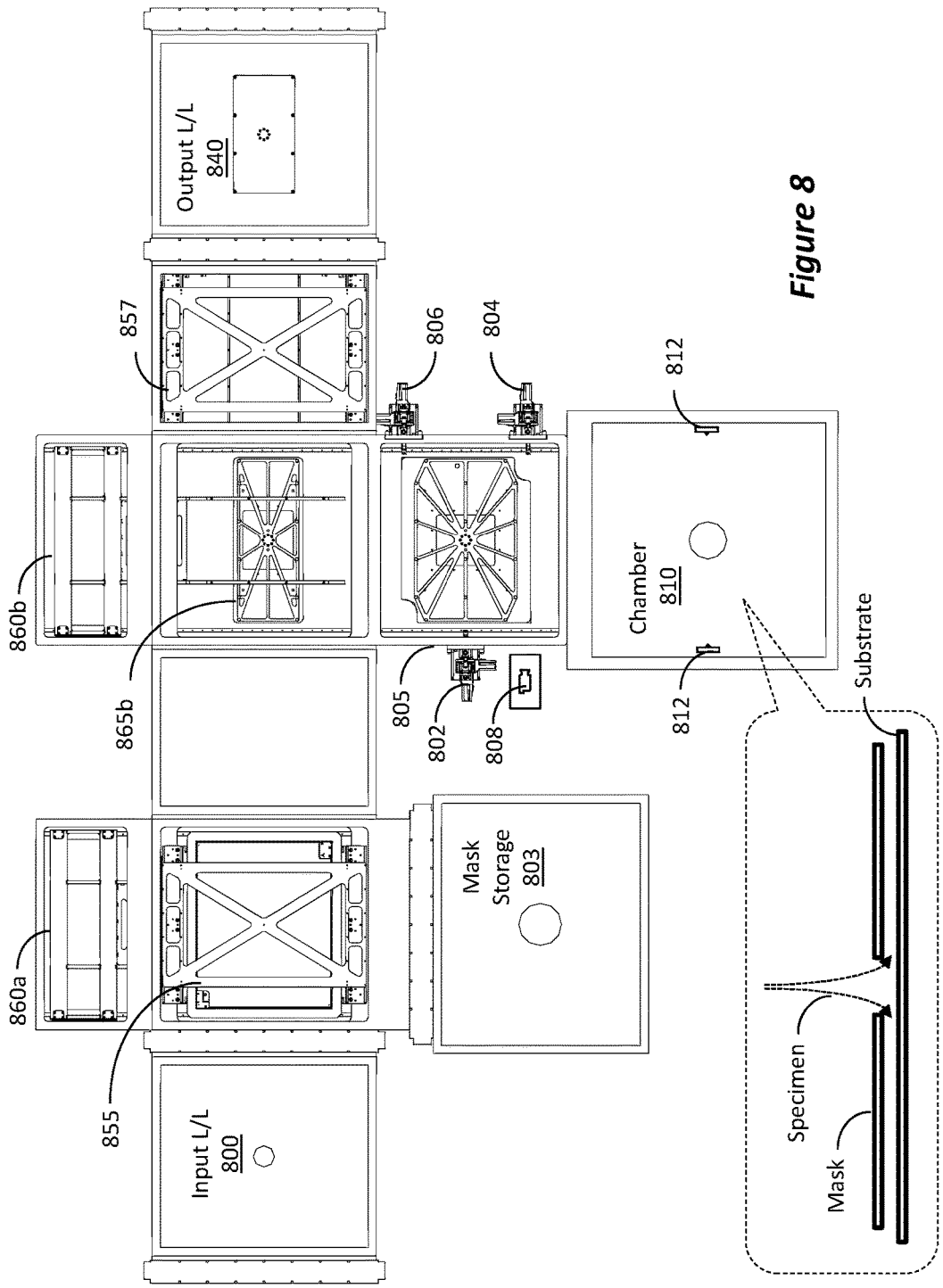
FIG. 8 illustrates a scalable, configurable system architecture for encapsulation which consist of one process chambers, mask alignment chamber, mask storage chamber, and input and output loadlocks, that maybe used to perform the encapsulation operations.

Specifically, in the embodiment of FIG. 8 processing chamber 810 includes mask lifters 812. Fresh substrates are loaded into the input loadlock chamber 800. As before, load carriage 855 loads a fresh substrate from loadlock 800 and y-axis loader 860b transfers the substrate into mask alignment chamber 805. In mask alignment chamber 805 three alignment actuators 802, 804 and 806 are used to translate and/or rotate the mask to align it to the substrate. The mask has openings that are sized to correspond to the mask opening required for forming the buffer layer, i.e., the smallest opening size. Camera 808 can be used to verify the alignment, which can be assisted by drawing target marks on the substrates.

Once aligned the substrate-mask pair is transported into the processing chamber. Prior to forming the first inorganic layer, the mask lifters 812 are actuated to lift the mask to a first processing height, thereby introducing a first gap between the mask and the substrate. Due to the gap, the deposited layer extends a bit under the mask, such that the deposited layer has periphery extending beyond the opening of the mask. This is illustrated by the callout in FIG. 8, wherein the deposition specimen is seen to flow into the gap between the mask and the substrate.

Once deposition of the inorganic layer is completed, the mask lifters 812 are actuated to lower the mask onto the substrate. The deposition of the buffer layer is performed. Since the mask now rests on top of the substrate, the deposition of the buffer layer is limited to the openings in the mask. Consequently the buffer layer does not reach the periphery of the first inorganic layer. When deposition of the buffer layer is completed, the mask lifters 812 are actuated to lift the mask to a second processing height, higher than the first processing height, thereby forming a second gap that is larger than the first gap. Deposition of the second inorganic layer than commences. Since the second gap is larger than the first gap, the deposition specimen will reach deeper under the mask's openings, thereby completely encapsulating the first inorganic layer.

As can be seen, by the embodiment of FIG. 8 a method for depositing a series of thin layers is provided, the method comprising the steps: aligning a mask to a substrate and placing the mask on top of the substrate; inserting the mask and the substrate into a deposition chamber; performing a first deposition step; raising the mask from the substrate inside the chamber to thereby create a gap between the mask and the substrate; and, performing a second deposition step.

The above disclosure also provides for a method for forming an encapsulation layer over a substrate, wherein after completing the deposition process the method includes the step of removing the substrate from the chamber while leaving the mask inside the deposition chamber; flowing fluorine gas into the deposition chamber; and igniting plasma inside the deposition chamber to thereby simultaneously clean the chamber and the mask. The method may further include the steps of, simultaneously with cleaning the chamber, transporting a fresh substrate into the mask aligning chamber and aligning a second mask onto the fresh substrate.

According to further embodiments, the disclose system can be used for depositing the inorganic layer, while the organic layer can be deposited by other tools, such as, e.g., an inkjet method. Then the substrates are returned to the disclosed system for the final inorganic layer.

Various embodiments were described above, wherein each embodiment is described with respect to certain features and elements. However, it should be understood that features and elements from one embodiment may be used in conjunction with other features and elements of other embodiments, and the description is intended to cover such possibilities, albeit not all permutations are described explicitly so as to avoid clutter.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method for forming a coating over an OLED structure having a contact layer and formed over a substrate, comprising:
   aligning a first mask over the substrate and forming through the first mask a first inorganic layer over the OLED structure and at least part of the contact layer;
   aligning a second mask over the substrate and forming through the second mask a buffer layer over the first inorganic layer;
   aligning a third mask over the substrate and forming through the third mask a second inorganic layer over the buffer layer;
   wherein the second mask has a smaller opening than the first mask.

2. The method of claim 1, wherein the third mask has same size opening as the first mask.

3. The method of claim 1, wherein the third mask has larger opening than the first mask.

4. The method of claim 1, wherein forming a buffer layer comprises flowing O2 and TMDSO gas into a plasma chamber.

5. The method of claim 4, wherein forming the buffer layer comprises at a first period adjusting O2 to TMDSO gas flow ratio to be eight or higher so as to form a first interface layer, at a second period adjusting O2 to TMDSO gas flow ratio to be two or lower so as to form an organic layer, and at a third period adjusting O2 to TMDSO gas flow ratio to be eight or higher so as to form a second interface layer.

6. The method of claim 1, wherein aligning the first, second and third mask is performed outside the processing chamber but inside vacuum.

7. The method of claim 1, further comprising maintaining at least one of the first, second and third masks in an empty processing chamber and igniting plasma inside the processing chamber to clean at least one of the first, second and third masks.

8. A method for coating a substrate having a plurality of OLED structures, each OLED structure having a contact layer, the method comprising:
   placing a mask over the substrate;
   placing the mask and substrate into a deposition chamber;
   energizing the deposition chamber and forming a first inorganic layer over the plurality of OLED structure and at least partially over each of the contact layers;
   energizing the deposition chamber and forming a buffer layer over the first inorganic layer;
   energizing the deposition chamber and forming a second inorganic layer over the buffer layer;
   wherein forming the buffer layer comprises forming a first inorganic interface layer in contact with the first inorganic layer, forming an organic layer over the first inorganic interface layer, and forming a second inorganic interface layer in contact with the organic layer; and,
   further comprising the step of, after forming the buffer layer but prior to forming the second inorganic layer, lifting the mask off the substrate inside the deposition chamber, so as to form a gap between the mask and substrate.

9. The method of claim 8, wherein forming the first inorganic interface layer and the second inorganic interface layer comprises forming SiOx.

10. A method for coating a substrate having a plurality of OLED structures, each OLED structure having a contact layer, the method comprising:
    placing a mask over the substrate;
    placing the mask and substrate into a deposition chamber;
    energizing, the deposition chamber and forming a first inorganic layer over the plurality of OLED structure and at least partially over each of the contact layers;
    energizing the deposition chamber and forming a buffer layer over the first inorganic layer;
    energizing the deposition chamber and forming a second inorganic layer over the buffer layer;
    wherein forming the buffer layer comprises forming a first inorganic interface layer in contact with the first inorganic layer, forming an organic layer over the first inorganic interface layer, and forming a second inorganic interface layer in contact with the organic layer;
    wherein forming the buffer layer comprises: adjusting flow ratio of O2 to tetramethydisiloxane (TMDSO) into the deposition chamber to equal to or be higher than eight to thereby form the first inorganic interface layer, adjusting flow ratio of O2 to TMDSO into the deposition chamber to equal two or below to form the organic layer, and adjusting flow ratio of O2 to TMDSO into the deposition chamber to equal to or be higher than eight to thereby form the second inorganic interface layer.

11. A method for coating a substrate having a plurality of OLED structures, each OLED structure having a contact layer, the method comprising:
    placing a mask over the substrate;
    placing the mask and substrate into a deposition chamber;
    energizing the deposition chamber and forming a first inorganic layer over the plurality of OLED structure and at least partially over each of the contact layers;
    removing the substrate from the deposition chamber;
    transferring the substrate into an organic layer forming apparatus and forming an organic buffer layer over the first inorganic layer;
    transferring the substrate into a deposition chamber and lifting the mask off the substrate to a prescribed processing height inside the deposition chamber, so as to form a gap between the mask and substrate; and,
    energizing the deposition chamber and forming a second inorganic layer over the organic buffer layer.

12. The method of claim 11, wherein forming an organic buffer layer comprises utilizing an inkjet printer to print the organic buffer layer.

13. The method of claim 11, wherein forming an organic buffer layer comprises forming Room-Temperature-Vulcanizing silicone (RTV) layer.

14. The method of claim 11, wherein forming an organic buffer layer comprises maintaining plasma-polymerized hexamethyldisiloxane (PP-HMDSO) in the organic layer forming apparatus.

15. The method of claim 11, wherein forming the second inorganic layer comprises covering the buffer layer and the periphery of the first inorganic layer so as to completely encase the buffer layer between the first and second inorganic layers.

16. A method for coating a substrate having a plurality of OLED structures, each OLED structure having a contact layer the method comprising:
 placing a mask over the substrate;
 placing the mask and substrate into a deposition chamber;
 energizing the deposition chamber and forming a first inorganic layer over the plurality of OLED stricture and at least partially over each of the contact layers;
 energizing the deposition chamber and forming a buffer layer over the first inorganic layer;
 energizing the deposition chamber and forming a second inorganic layer over the buffer layer;
 wherein forming the buffer layer comprises forming a first inorganic interface layer in contact with the first inorganic layer, forming an organic layer over the first inorganic interface layer, and forming a second inorganic interface layer in contact with the organic layer, and
 wherein forming the buffer layer comprises igniting plasma in the deposition chamber to form plasma-polymerized tetramethyldisiloxane (pp-TMDSO).

17. The method of claim 16, wherein forming the second inorganic layer comprises covering the buffer layer and the periphery of the first inorganic layer so as to completely encase the buffer layer between the first and second inorganic layers.

18. The method of claim 16, wherein forming the buffer layer comprises forming the buffer layer to cover the first inorganic layer, except for a periphery area of the first inorganic layer.

* * * * *